(12) United States Patent
Dong et al.

(10) Patent No.: US 12,210,081 B2
(45) Date of Patent: Jan. 28, 2025

(54) MOTION CORRECTION METHOD AND APPARATUS IN MR IMAGING, MR IMAGING SYSTEM, AND STORAGE MEDIUM

(71) Applicant: Siemens Healthcare GmbH, Erlangen (DE)

(72) Inventors: Fang Dong, Shenzhen (CN); Yan Tu Huang, Shenzhen (CN)

(73) Assignee: Siemens Healthineers AG, Erlangen (DE)

( * ) Notice: Subject to any disclaimer, the term of this patent is extended or adjusted under 35 U.S.C. 154(b) by 13 days.

(21) Appl. No.: 17/954,483

(22) Filed: Sep. 28, 2022

(65) Prior Publication Data

US 2023/0101609 A1    Mar. 30, 2023

(30) Foreign Application Priority Data

Sep. 28, 2021  (CN) .......................... 202111140555.2

(51) Int. Cl.
*G01V 3/00* (2006.01)
*G01R 33/54* (2006.01)
(Continued)

(52) U.S. Cl.
CPC ..... *G01R 33/56509* (2013.01); *G01R 33/543* (2013.01); *G06T 5/00* (2013.01); *G06T 5/50* (2013.01); *G06T 2207/10088* (2013.01)

(58) Field of Classification Search
CPC .. G01R 33/56509; G01R 33/543; G06T 5/00; G06T 5/50
(Continued)

(56) References Cited

U.S. PATENT DOCUMENTS

2022/0230318 A1    7/2022  Huang

FOREIGN PATENT DOCUMENTS

| CN | 106780643 A | * | 5/2017 | |
| CN | 108141509 A | * | 6/2018 | .......... G06T 3/4015 |

(Continued)

OTHER PUBLICATIONS

Maryna Waszak et al., "Prospective Head Motion Correction Using FID-Guided On-Demand Image Navigators," Magnetic Resonance in Medicine 78:193-203, 2017.

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

In a motion correction method, a reference navigation image is obtained before MR data collection is performed on a target region of interest; in a process of performing the MR data collection on the target region of interest, motion detection is performed using a pilot tone signal received by a plurality of coils, and when a motion is detected, MR data collected when the motion occurs is marked as motion damage data; a post-motion navigation image is obtained when the end of the motion is detected by utilizing the pilot tone signal; registration is performed on the post-motion navigation image and the reference navigation image to obtain a motion correction parameter corresponding to the motion; and motion correction on the MR data collection is performed using the motion correction parameter. The method according to the present disclosure advantageously improves MR imaging quality.

16 Claims, 4 Drawing Sheets

(51) Int. Cl.
   *G01R 33/565* (2006.01)
   *G06T 5/00* (2006.01)
   *G06T 5/50* (2006.01)

(58) Field of Classification Search
   USPC .......................................................... 324/309
   See application file for complete search history.

(56) References Cited

FOREIGN PATENT DOCUMENTS

| | | | | |
|---|---|---|---|---|
| CN | 109238306 A | * | 1/2019 | ........... G01C 22/006 |
| DE | 102004024470 A1 | * | 12/2005 | ....... G01R 33/56509 |
| DE | 102013222103 A1 | * | 5/2015 | ............. A61B 5/055 |
| JP | 2014161566 A | * | 9/2014 | |

* cited by examiner

MOTION CORRECTION METHOD AND APPARATUS IN MR IMAGING, MR IMAGING SYSTEM, AND STORAGE MEDIUM

CROSS REFERENCE TO RELATED APPLICATIONS

This patent application claims priority to Chinese Patent Application No. 202111140555.2, filed Sep. 28, 2021, which is incorporated herein by reference in its entirety.

BACKGROUND

Field

The present disclosure relates to the field of magnetic resonance (MR) imaging technologies, and in particular, to a motion correction method and apparatus in MR imaging, an MR imaging system, and a computer-readable storage medium.

Related Art

MR imaging is an imaging technique using a magnetic resonance phenomenon. The principles of MR imaging are mainly as follows: for nuclei containing an odd number of protons, for example, hydrogen nuclei widely existing in a human body, the protons thereof are in a spin motion, like small magnets, and the small magnets have irregular axes of spin. If an external magnetic field is applied, the small magnets will be rearranged according to magnetic lines of force of the external magnetic field, and are specifically arranged in two directions, i.e., directions parallel to and anti-parallel to the magnetic lines of force of the external magnetic field. The direction parallel to the magnetic lines of force of the external magnetic field mentioned above is referred to as a positive longitudinal axis, and the direction anti-parallel to the magnetic lines of force of the external magnetic field mentioned above is referred to as a negative longitudinal axis. The nuclei only have a longitudinal magnetization component that has both a direction and an amplitude. Nuclei in the external magnetic field are excited by radio frequency (RF) pulses at a specific frequency such that the axes of spin of the nuclei deviate from the positive longitudinal axis or the negative longitudinal axis so as to produce resonance, which is the magnetic resonance phenomenon. After the axes of spin of the excited nuclei mentioned above deviate from the positive longitudinal axis or the negative longitudinal axis, the nuclei have a transverse magnetization component.

After the radio frequency pulses stop being transmitted, the excited nuclei transmit echo signals and gradually release the absorbed energy in the form of electromagnetic waves. Both the phase and energy level thereof are restored to the state before being excited, and the echo signals transmitted by the nuclei are subjected to further processing such as space encoding such that the image can be reconstructed. The above process of the excited nuclei being recovered to the state before being excited is referred to as a relaxation process, and the time required for recovery to an equilibrium state is referred to as a relaxation time.

A gradient magnetic field is a magnetic field applied on the basis of the main magnetic field, which causes a slight difference in the magnetic field intensity of a target region of interest during imaging. According to Larmor's Theorem on magnetic resonance, resonance frequencies of human tissues will be different under different magnetic field intensities. Spatial localization of MR imaging is primarily accomplished by a gradient magnetic field. Applying a gradient magnetic field on a relatively uniform main magnetic field will cause hydrogen protons at different parts of a human body to be at different magnetic field intensities, thus having different Larmor frequencies. Excitation with different RFs will result in selective excitation of the corresponding protons, and the constantly changing gradient magnetic field in cooperation with a correspondingly changing RF generator will achieve the purpose of spatial localization. The location determination based on changes of the gradient magnetic field does not require the movement of a patient to be examined.

During MR imaging, patient motions may cause severe artifacts in images. Therefore, many methods for detecting/correcting motions have been proposed at present, but most of them are limited by a specific sequence or a specific situation, and there is no general motion correction solution.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
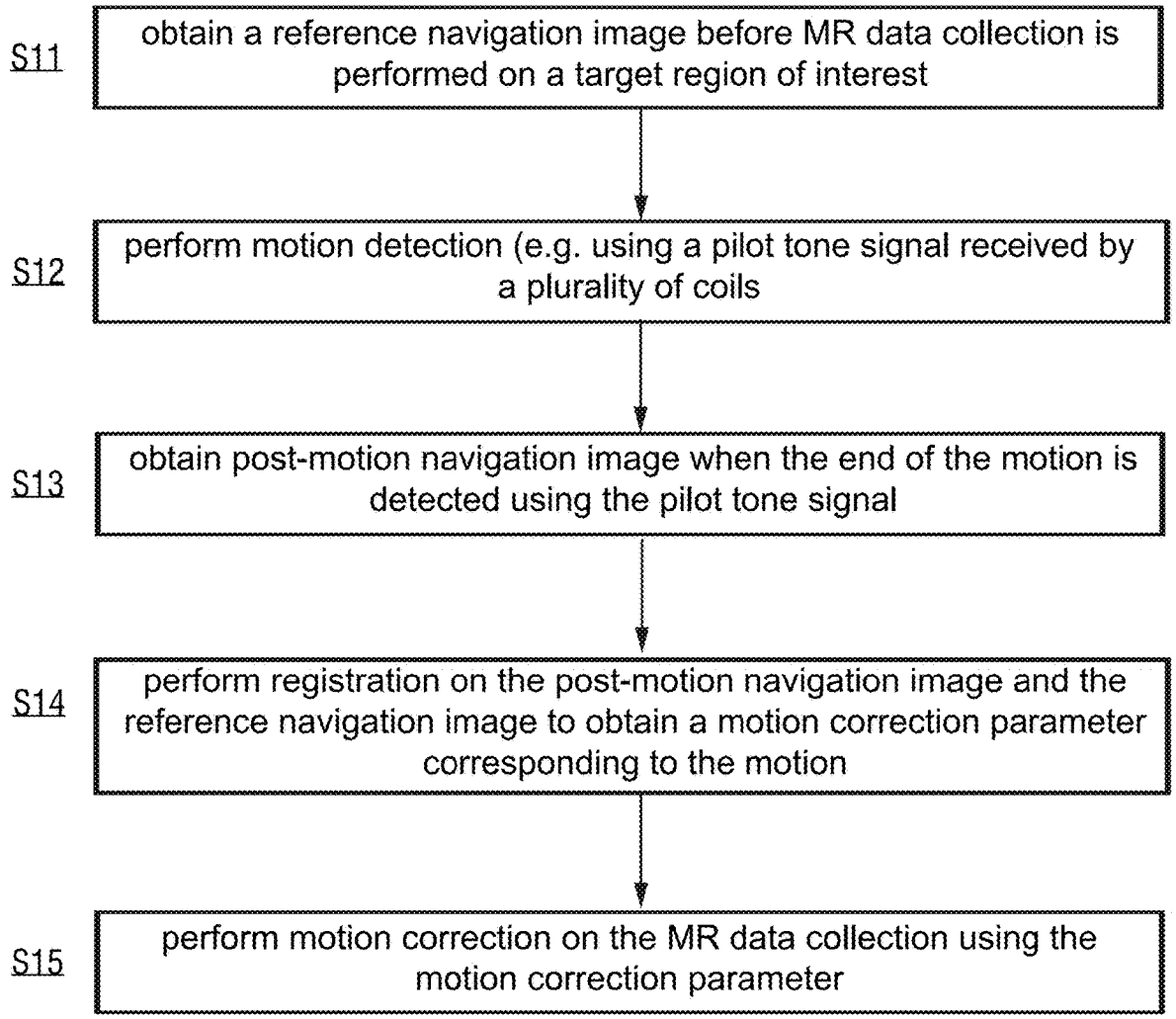
FIG. 1 is a flowchart of a motion correction method in MR imaging according to an exemplary embodiment of the present disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure is to provide a motion correction method in MR imaging in an aspect, and a motion correction apparatus in MR imaging and a computer-readable storage medium in other aspects, to improve MR imaging quality.

The motion correction method in MR imaging proposed in an embodiment of the present disclosure may include: obtaining a reference navigation image before MR data collection is performed on a target region of interest; in a process of performing the MR data collection on the target region of interest, performing motion detection by utilizing a pilot tone signal received by a plurality of coils, and when a motion is detected, marking MR data collected when the motion occurs as motion damage data; obtaining a post-motion navigation image when the end of the motion is detected by utilizing the pilot tone signal; performing registration on the post-motion navigation image and the reference navigation image to obtain a motion correction parameter corresponding to the motion; and performing motion correction on the MR data collection by utilizing the motion correction parameter.

In an exemplary embodiment, the performing motion correction on the MR data collection by utilizing the motion correction parameter may include: adjusting a currently applied gradient magnetic field based on the motion correction parameter, to keep the target region of interest static relative to a scanning field of view; and restarting the MR data collection from a position where the MR data is marked (identified) as the motion damage data until the MR data collection ends, or when a next motion is detected by utilizing the pilot tone signal, returning to perform the operation of marking MR data collected when the motion occurs as motion damage data.

In an exemplary embodiment, the performing motion correction on the MR data collection by utilizing the motion correction parameter may include: restarting the MR data collection from a position where the MR data is marked as the motion damage data until the MR data collection ends, or when a next motion is detected by utilizing the pilot tone signal, returning to perform the operation of marking MR data collected when the motion occurs as motion damage data; and when the MR data collection ends, performing motion correction on MR data re-collected after each motion occurs by utilizing a motion correction parameter corresponding to the motion.

In an exemplary embodiment, the motion correction method in MR imaging may further include: when the motion is detected by utilizing the pilot tone signal, triggering an automatic voice command used to prompt a patient to keep static.

In an exemplary embodiment, the motion correction method in MR imaging may further include: counting the number of detected motions, popping up a dialog box or an operation box or a voice instruction when a count value reaches a set threshold, to ask a user whether the user wants to stop scanning due to frequent motions, and stopping current MR data collection when a reply indicating "yes" from the user is received, or continuing with the current MR data collection when a reply indicating "no" from the user is received.

In an exemplary embodiment, the motion correction method in MR imaging may further include: providing predefined high-, moderate- and low-motion magnitude options for a user, and determining, based on a received user selection, a motion magnitude triggering to perform the operation of obtaining a post-motion navigation image.

The motion correction apparatus in MR imaging proposed in an embodiment of the present disclosure may include: a motion detector, configured to: in a process of MR data collection, perform motion detection by utilizing a pilot tone signal received by a plurality of coils, output a first signal when a motion is detected, and output a second signal when the end of the motion is detected; and a control processor, configured to: control an MR data collection apparatus to perform MR data collection on a target region of interest, and obtain MR data collected by the MR data collection apparatus; before controlling the MR data collection apparatus to perform the MR data collection, control the MR data collection apparatus to collect a reference navigation image, and obtain the reference navigation image; mark MR data collected when the motion occurs as motion damage data when the first signal is received; when the second signal is received, control the MR data collection apparatus to collect a post-motion navigation image, obtain the post-motion navigation image, and perform registration on the post-motion navigation image and the reference navigation image to obtain a motion correction parameter corresponding to the motion; and perform motion correction on the MR data collection by utilizing the motion correction parameter.

In an exemplary embodiment, the control processor may include: a controller, configured to control an MR data collection apparatus to perform MR data collection on a target region of interest, and before the MR data collection, control the MR data collection apparatus to collect a reference navigation image; when the second signal is received, control the MR data collection apparatus to collect a post-motion navigation image; and when a motion correction parameter is obtained, control, based on the motion correction parameter, a gradient magnetic field applied for current MR imaging for adjustment, to keep the target region of interest static relative to a scanning field of view, and control the MR data collection apparatus to restart the MR data collection from a position where the MR data is marked as the motion damage data; and a processor, configured to receive the reference navigation image and the MR data that are collected by the MR data collection apparatus, and mark the MR data collected when the motion occurs as the motion damage data when the first signal is received; and perform registration on the post-motion navigation image and the reference navigation image when the post-motion navigation image collected by the MR data collection apparatus is obtained, to obtain the motion correction parameter corresponding to the motion, and provide the motion correction parameter for the controller.

In an exemplary embodiment, the control processor may include: a controller, configured to control an MR data collection apparatus to perform MR data collection on a target region of interest, and before the MR data collection, control the MR data collection apparatus to collect a reference navigation image; and when the second signal is received, control the MR data collection apparatus to collect a post-motion navigation image, and then control the MR data collection apparatus to restart the MR data collection from a position where MR data is marked as motion damage data; and a processor, configured to receive the reference navigation image and the MR data that are collected by the MR data collection apparatus, and mark the MR data collected when the motion occurs as the motion damage data when the first signal is received; perform registration on the post-motion navigation image and the reference navigation image when the post-motion navigation image collected by the MR data collection apparatus is obtained, to obtain the motion correction parameter corresponding to the motion; and when the MR data collection apparatus ends the MR data collection, perform motion correction on MR data re-collected after each motion occurs by utilizing a motion correction parameter corresponding to the motion.

In an exemplary embodiment, the motion correction apparatus in MR imaging may further include: a first prompt module, configured to: when the first signal is received, trigger an automatic voice command used to prompt a patient to keep static.

In an exemplary embodiment, the motion correction apparatus in MR imaging may further include: a second prompt module, configured to count the number of detected motions based on the received first signal, pop up a dialog box or an operation box or a voice instruction when a count value reaches a set threshold, to ask a user whether the user wants to stop scanning due to frequent motions, and send a third signal to the control processor when a reply indicating "yes" from the user is received, where the control processor controls the MR data collection apparatus to stop MR data collection based on the third signal.

In an implementation, the motion correction apparatus in MR imaging may further include: a configuration module, configured to provide predefined high-, moderate- and low-motion magnitude options for a user, and configure, based on a received user option, the motion detector with a motion magnitude triggering to perform the operation of sending a first signal.

The motion correction apparatus in MR imaging proposed in an embodiment of the present disclosure may include: at least one memory and at least one processor, where the at least one memory is configured to store a computer program; and the at least one processor is configured to invoke the computer program stored in the at least one memory to perform the motion correction method in MR imaging according to any one of the above implementations.

The computer-readable storage medium provided in an embodiment of the present disclosure has a computer program stored thereon, where the computer program is capable of being executed by a processor to implement the motion correction method in MR imaging according to any one of the above implementations.

It can be seen from the above solutions that, in the embodiments of the present disclosure, the pilot tone signal may be used to perform motion detection, the MR data collected when the motion occurs may be marked as the motion damage data, the reference navigation image may be obtained before the MR data collection, the post-motion navigation image may be obtained when it is detected that the motion stops, the motion correction parameter corresponding to the motion may be obtained by performing registration on the post-motion navigation image and the reference navigation image, then a gradient magnetic field may be adjusted by utilizing the motion correction parameter to complete prospective motion correction, and then the MR data collection may be restarted from the position where the MR data is marked as the motion damage data; or, the MR data collection may be restarted directly from the position where the MR data is marked as the motion damage data, and finally the motion correction parameter may be further utilized to perform retrospective motion correction on re-collected data. After that, a current MR image may be obtained based on the MR signal data after the motion correction and MR signal data before the motion damage data, so that the collected image can be accurately corrected, thereby improving the MR imaging quality.

In embodiments of the present disclosure, a pilot tone signal that is very sensitive to the motions may be used to detect motion for motion correction not limited by a specific imaging sequence. The patient may be prompted to keep static when a motion is detected. Further, a navigation image can also be used to obtain accurate motion information, for example, calculating a motion correction parameter, and triggering prospective motion correction or retrospective motion correction.

Figure 2:
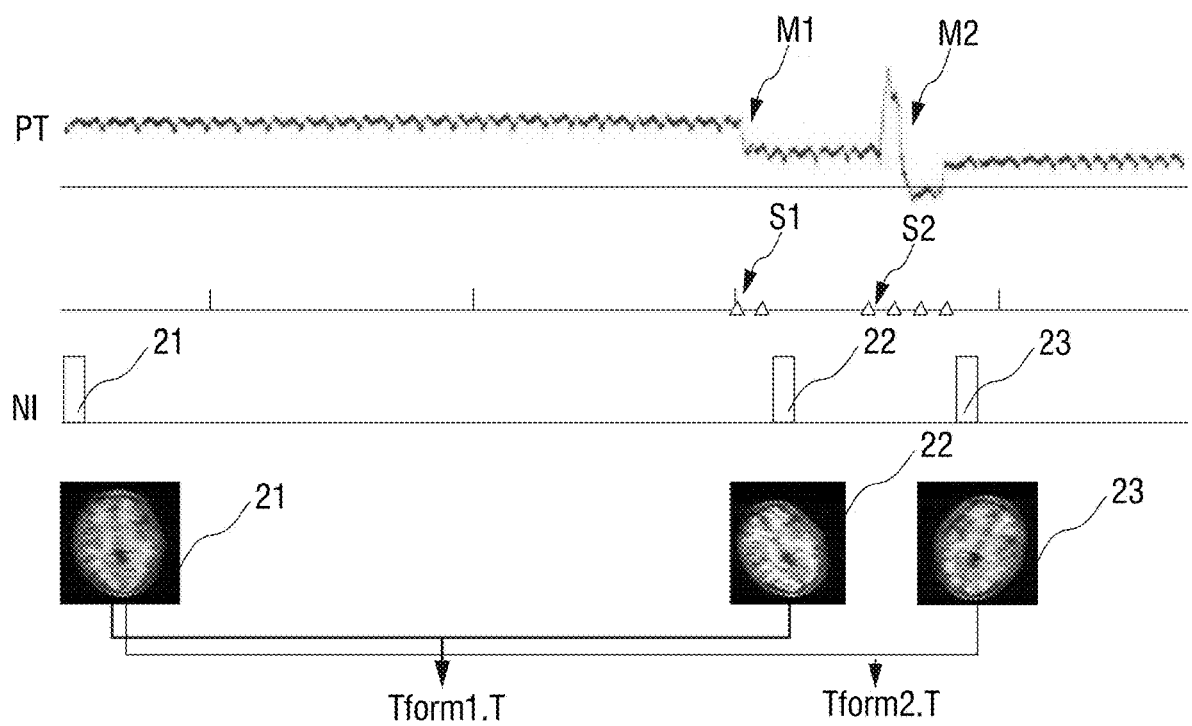
FIG. 2 is a schematic diagram of collecting a navigation image under the guidance of pilot tone signals according to an exemplary embodiment of the present disclosure.

FIG. 1 is an exemplary flowchart of a motion correction method in MR imaging in an embodiment of the present disclosure. FIG. 2 is a schematic diagram of collecting a navigation image (NI) under the guidance of pilot tone (PT) signals in an example of the present disclosure. As shown in FIG. 1 and FIG. 2, the method may include the following operations.

In step S11, a reference navigation image is obtained before MR data collection is performed on a target region of interest.

The navigation image is a low-resolution image. As shown in FIG. 2, a reference navigation image 21 is obtained before the MR data collection is performed.

In step S12, in a process of the MR data collection, motion detection is performed by utilizing a pilot tone signal received by a plurality of coils, and when a motion is detected, MR data collected when the motion occurs is marked as motion damage data.

In this embodiment, there are various implementation methods for performing motion detection by utilizing a pilot tone signal. For example, FIG. 3 is schematic diagram showing performing motion detection by utilizing a pilot tone signal in an example.

Figure 3:
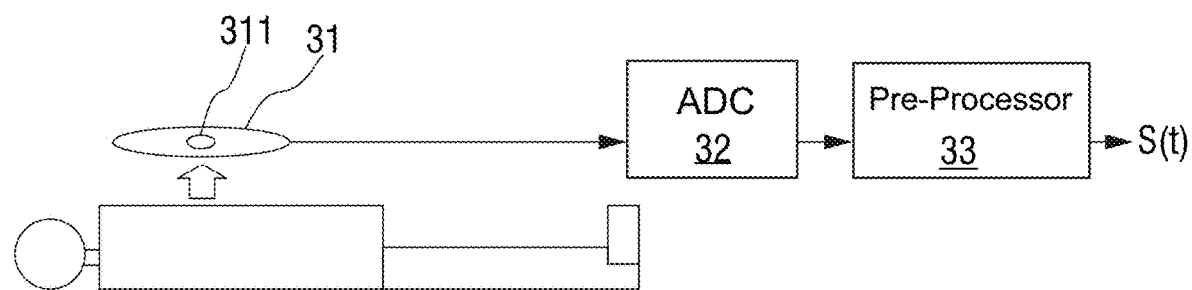
FIG. 3 is a schematic diagram of performing motion detection by utilizing pilot tone signals according to an exemplary embodiment of the present disclosure.

As shown in FIG. 3, in an MR imaging system, a transmit antenna 311 may be provided in the local coil 31 and configured to transmit a radio frequency signal with a frequency slightly lower or higher than the MR center frequency, then the radio frequency signal may be modulated by breathing/heartbeat or a body motion, and the modulated signal may be received by an MR receiving coil. A digitized motion modulated pilot tone signal S(t) may be obtained through A/D conversion (e.g. by an analog-to-digital converter (ADC) 32) and pre-processing (filtering out the MR signal) (e.g. by a pre-processor 33).

As shown in FIG. 2, when a first motion M1 is sequentially detected by utilizing a pilot tone signal, MR data may be marked/identified as damage at a corresponding collection position, as shown by the small triangular mark S1 in FIG. 2, that is, MR data collected when the motion occurs is marked as motion damage data. Likewise, when a second motion M2 is sequentially detected by utilizing a pilot tone signal, MR data is also marked as damage at a corresponding collection position, as shown by the small triangular mark S2 in FIG. 2.

In step S13, a post-motion navigation image may be obtained when the end of the motion is detected by utilizing the pilot tone signal.

As shown in FIG. 2, a first post-motion navigation image 22 may be obtained when it is detected that the first motion M1 stops. Likewise, a second post-motion navigation image 23 is obtained when it is detected that the second motion M2 stops.

In step S14, registration may be performed on the post-motion navigation image and the reference navigation image to obtain a motion correction parameter corresponding to the motion.

In an exemplary embodiment, when the registration is performed on the post-motion navigation image and the reference navigation image, a geometric transformation matrix may be obtained, and the motion transformation matrix is the motion correction parameter corresponding to the motion.

As shown in FIG. 2, when registration is performed on the first post-motion navigation image 22 and the reference navigation image 21, a geometric transformation matrix that may be obtained is Tform1.

$$T = \begin{bmatrix} 0.905 & 0.424 & 0 \\ -0.424 & 0.905 & 0 \\ 77.43 & -34.38 & 1 \end{bmatrix}.$$

Likewise, when registration is performed on the second post-motion navigation image 23 and the reference navigation image 21, a geometric transformation matrix that may be obtained is:

$$Tform2. \ T = \begin{bmatrix} 0.852 & -0.524 & 0 \\ 0.524 & 0.852 & 0 \\ -68.03 & 83.95 & 1 \end{bmatrix}.$$

In step S15, motion correction is performed on the MR data collection by utilizing the motion correction parameter.

Step S15 may have a plurality of specific implementations. Two of these implementations are listed below:

Implementation 1: Prospective Motion Correction

In step A1, a currently applied gradient magnetic field is adjusted based on the motion correction parameter to keep the target region of interest static relative to a scanning field of view (FOV).

In the example shown in FIG. 2, after the first motion M1 is detected and the motion correction parameter Tform1. T corresponding to the first motion M1 is calculated, the currently applied gradient magnetic field is adjusted based on the motion correction parameter Tform1. T to keep the target region of interest static relative to the FOV; and after the second motion M2 is detected and the motion correction parameter Tform2. T corresponding to the second motion M2 is calculated, the currently applied gradient magnetic field is adjusted based on the motion correction parameter Tform2. T to keep the target region of interest static relative to the FOV.

In step A2, the MR data collection is restarted from a position where the MR data is marked as the motion damage data until the MR data collection ends, or when a next motion is detected by utilizing the pilot tone signal, the operation of marking MR data collected when the motion occurs as motion damage data is performed again.

In the example shown in FIG. 2, after the gradient magnetic field is adjusted based on the motion correction parameter Tform1. T corresponding to the first motion M1 in step A1, the MR data at the collection position corresponding to the small triangular mark S1 in step A2 may be discarded, and the MR data collection is restarted from the collection position corresponding to the first small triangular mark S1 until the second motion M2 is detected in step S12; and after the gradient magnetic field is adjusted based on the motion correction parameter Tform2. T corresponding to the second motion M2 in step A1, the MR data at the collection position corresponding to the small triangular mark S2 in step A2 may be discarded, and the MR data collection is restarted from the collection position corresponding to the second small triangular mark S2 until the MR data collection ends or a next motion is detected by utilizing the pilot tone signal in step S12.

In an exemplary embodiment, before MR data collection is started each time, several dummy scans may be performed to keep a stable state during MR scanning Implementation 2: Retrospective Motion Correction In step B1, the MR data collection is restarted from a position where the MR data is marked as the motion damage data until the MR data collection ends, or when a next motion is detected by utilizing the pilot tone signal, the operation of marking MR data collected when the motion occurs as motion damage data is performed again.

In the example shown in FIG. 2, after the first motion M1 is detected and the motion correction parameter Tform1. T corresponding to the first motion M1 is calculated, the MR data at the collection position corresponding to the small triangular mark S1 may be discarded, and the MR data collection is restarted from the collection position corresponding to the first small triangular mark S1 until the second motion M2 is detected in step S12; and after the second motion M2 is detected and the motion correction parameter Tform2. T corresponding to the second motion M2 is calculated, the MR data at the collection position corresponding to the small triangular mark S2 may be discarded, and the MR data collection is restarted from the collection position corresponding to the second small triangular mark S2 until the MR data collection ends or a next motion is detected by utilizing the pilot tone signal in step S12.

In an exemplary embodiment, before MR data collection is started each time, several dummy scans may be performed to keep a stable state during MR scanning.

In step B2, when the MR data collection ends, motion correction is performed on MR data re-collected after each motion occurs by utilizing a motion correction parameter corresponding to the motion.

In the example shown in FIG. 2, motion correction is performed, by utilizing the motion correction parameter Tform1. T corresponding to the first motion M1, on MR data collected after the first motion M1 occurs and before the second motion M2 occurs; and motion correction is performed, by utilizing the motion correction parameter Tform2. T corresponding to the second motion M2, on MR data collected after the second motion M2 occurs (if no further motion subsequently occurs).

After that, a current MR image may be obtained based on the MR data after the motion correction and the MR data before the motion damage data, so that images collected based on respective sequences can be accurately corrected, thereby improving the MR imaging quality.

In addition, an automatic voice command used to prompt a patient to keep static may also be triggered when the motion is detected by utilizing the pilot tone signal.

Further, the number of detected motions may be further counted, a dialog box or an operation box or a voice instruction may be popped up when a count value reaches a set threshold, to ask a user whether the user wants to stop scanning due to frequent motions, and current MR data collection may be stopped when a reply indicating "yes" from the user is received, or the current MR data collection is continued with when a reply indicating "no" from the user is received.

In addition, in an exemplary embodiment, predefined high-, moderate- and low-motion magnitude options may be further provided for a user, and a motion magnitude triggering to perform the operation of obtaining a post-motion navigation image may be determined based on a received user selection.

In this embodiment, based on a scanning sequence used by the current MR scanning, the navigation image may be a 3D navigation image or a 2D navigation image, which may be specifically determined according to actual conditions.

A method embodiment in the embodiments of the present disclosure is described in detail above, and an apparatus embodiment in the embodiments of the present disclosure will be described in detail below. For details not disclosed in the apparatus embodiment of the present disclosure, reference may be made to the corresponding description in the method embodiment of the present disclosure, and the details are not described herein again.

Figure 4:
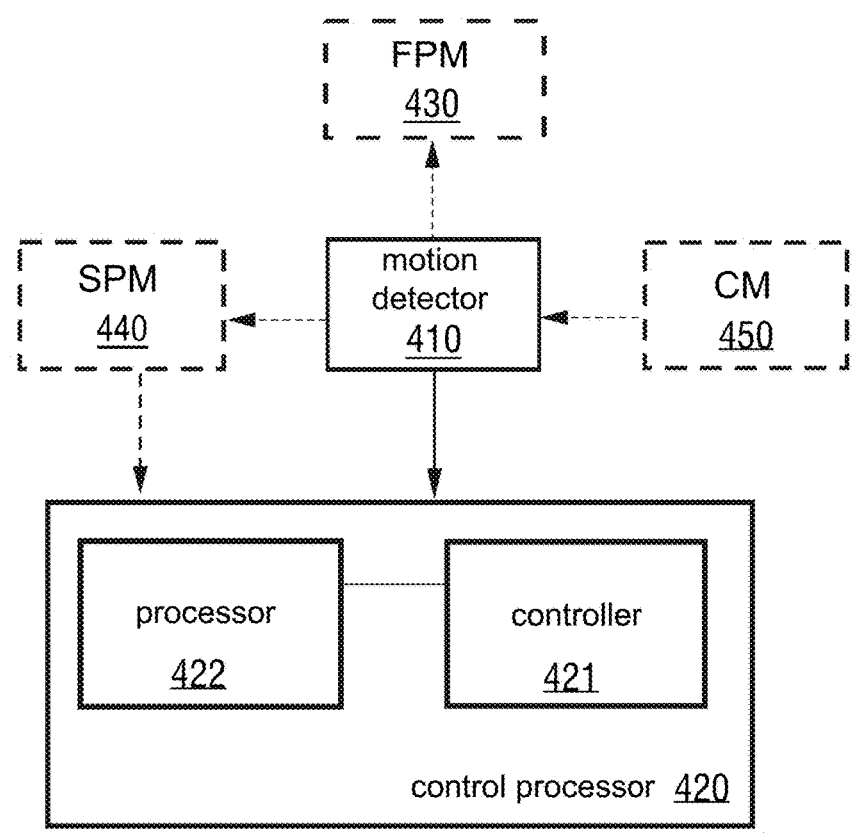
FIG. 4 shows a motion correction apparatus in MR imaging according to an exemplary embodiment of the present disclosure.

FIG. 4 is an exemplary structural diagram of a motion correction apparatus in MR imaging in an embodiment of the present disclosure. As shown by the solid-line portions in FIG. 4, the apparatus may include: a motion detector 410 and a control processor 420.

The motion detector 410 is configured to: in a process of MR data collection, perform motion detection by utilizing a pilot tone signal received by a plurality of coils, output a first signal when a motion is detected, and output a second signal when the end of the motion is detected.

In an exemplary embodiment, the motion detector 410 includes processing circuitry that is configured to perform one or more functions and/or operations of motion detector 410.

The control processor 420 is configured to: control an MR data collection apparatus to perform MR data collection on a target region of interest, and obtain MR data collected by the MR data collection apparatus; before controlling the MR data collection apparatus to perform the MR data collection, control the MR data collection apparatus to collect a reference navigation image, and obtain the reference navigation image; mark MR data collected when the motion occurs as motion damage data when the first signal is received; when the second signal is received, control the MR data collection apparatus to collect a post-motion navigation image, obtain the post-motion navigation image, and perform registration on the post-motion navigation image and the reference navigation image to obtain a motion correction parameter corresponding to the motion; and perform motion correction on the MR data collection by utilizing the motion correction parameter.

In an exemplary embodiment, the control processor 420 may include: a controller 421 and a processor 422. The functions of the controller 421 and the processor 422 may also be different in different implementations. In an exemplary embodiment, the control processor 420 includes processing circuitry that is configured to perform one or more functions and/or operations of the control processor 420.

For example, in an exemplary embodiment, the controller 421 is configured to control an MR data collection apparatus to perform MR data collection on a target region of interest, and before the MR data collection, control the MR data collection apparatus to collect a reference navigation image; when the second signal is received, control the MR data collection apparatus to collect a post-motion navigation image; and when a motion correction parameter is obtained, control, based on the motion correction parameter, a gradient magnetic field applied for current MR imaging for adjustment, to keep the target region of interest static relative to the FOV, and control the MR data collection apparatus to restart the MR data collection from a position where the MR data is marked as the motion damage data. In an exemplary embodiment, the controller 421 includes processing circuitry that is configured to perform one or more functions and/or operations of the controller 421.

The processor 422 is configured to receive the reference navigation image and the MR data that are collected by the MR data collection apparatus, and mark the MR data collected when the motion occurs as the motion damage data when the first signal is received; and perform registration on the post-motion navigation image and the reference navigation image when the post-motion navigation image collected by the MR data collection apparatus is obtained, to obtain the motion correction parameter corresponding to the motion, and provide the motion correction parameter for the controller 421. In an exemplary embodiment, the processor 422 includes one or more microprocessors, digital signal processors (DSPs), central processors (CPUs), application-specific instruction set processors (ASIPs), graphics and/or image processors, multi-core processors, other hardware processors, and/or other processing circuitry.

In an exemplary embodiment, the controller 421 is configured to control an MR data collection apparatus to perform MR data collection on a target region of interest, and before the MR data collection, control the MR data collection apparatus to collect a reference navigation image; when the second signal is received, control the MR data collection apparatus to collect a post-motion navigation image; and then control the MR data collection apparatus to restart the MR data collection from a position where MR data is marked as motion damage data. The processor 422 is configured to receive the reference navigation image and the MR data that are collected by the MR data collection apparatus, and mark the MR data collected when the motion occurs as the motion damage data when the first signal is received; perform registration on the post-motion navigation image and the reference navigation image when the post-motion navigation image collected by the MR data collection apparatus is obtained, to obtain the motion correction parameter corresponding to the motion; and when the MR data collection apparatus ends the MR data collection, perform motion correction on MR data re-collected after each motion occurs by utilizing a motion correction parameter corresponding to the motion.

After that, a current MR image may be obtained based on the MR data after the motion correction and the MR data before the motion damage data, so that images collected based on respective sequences can be accurately corrected, thereby improving the MR imaging quality.

In addition, in an exemplary embodiment, as shown by the dotted-line portions in FIG. 4, the apparatus may further include: a first prompt module 430, configured to: when the first signal is received, trigger an automatic voice command used to prompt a patient to keep static.

In an exemplary embodiment, the apparatus may further include: a second prompt module 440, configured to count the number of detected motions based on the received first signal, pop up a dialog box or an operation box or a voice instruction when a count value reaches a set threshold, to ask a user whether the user wants to stop scanning due to frequent motions, and send a third signal to the control processor 420 when a reply indicating "yes" from the user is received, where the control processor 420 controls, based on the third signal, the MR data collection apparatus to stop the MR data collection.

In an exemplary embodiment, the apparatus may further include: a configuration module 450, configured to provide predefined high-, moderate- and low-motion magnitude options for a user, and configure, based on a received user option, the motion detector 410 with a motion magnitude triggering to perform the operation of sending a first signal. The magnitude options may include fewer or more options according to the disclosure.

In an exemplary embodiment, the first prompt module 430, second prompt module 440, and/or the configuration module 450 includes processing circuitry that is configured to perform one or more corresponding functions and/or operations of the respective component(s).

Figure 5:
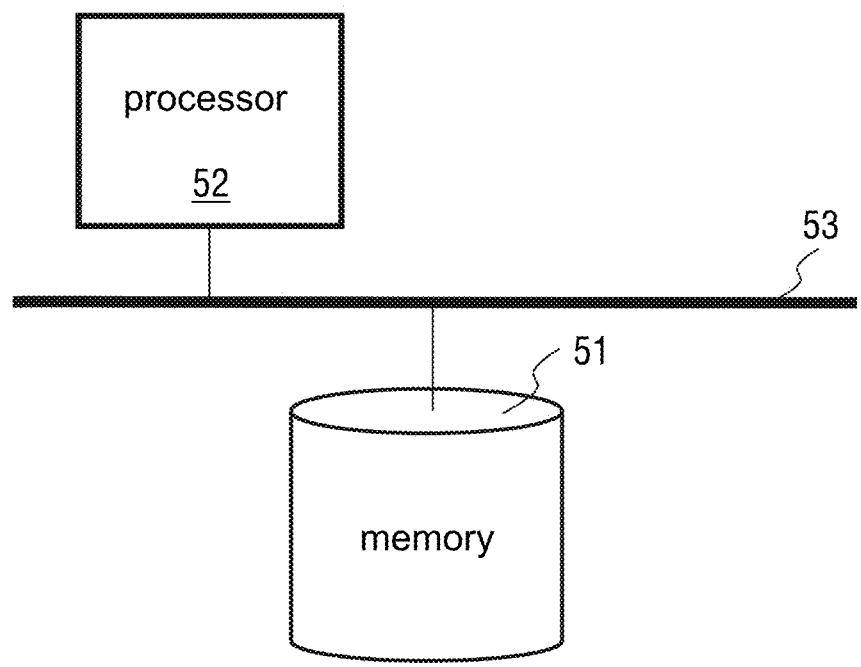
FIG. 5 shows a motion correction apparatus in MR imaging according to an exemplary embodiment of the present disclosure.

FIG. 5 is a schematic structural diagram of another motion correction apparatus in MR imaging according to an embodiment of the present application. The apparatus may be configured to implement the method shown in FIG. 1, or to implement the motion correction apparatus in MR imaging shown in FIG. 4. As shown in FIG. 5, the system may include: at least one memory 51 and at least one processor 52. In addition, some other components, such as a communication port, may further be included. The components communicate with each other by a bus 53.

The at least one memory 51 is configured to store a computer program. In an exemplary embodiment, the computer program may be understood as including various modules of the motion correction apparatus in MR imaging shown in FIG. 4. In addition, the at least one memory 51 may further store an operating system, etc. The operating system includes, but is not limited to: an Android operating system, a Symbian operating system, a Windows operating system, a Linux operating system, etc.

The at least one processor 52 is configured to execute the computer program stored in the at least one memory 51, and to perform the motion correction method in MR imaging according to the embodiments of the present disclosure. The processor 52 may be a CPU, a processing unit/module, an ASIC, a logic module or a programmable gate array, etc. The processor may perform data receiving and sending by using the communication port.

Specifically, the at least one processor 52 is configured to execute the computer program stored in the at least one memory 51 to cause the system to perform the operations in the motion correction method in MR imaging in any of the exemplary embodiments of the disclosure.

It needs to be noted that not all the steps and modules in the flows and structural diagrams described above are necessary, and some steps or modules may be omitted according to practical requirements. The execution order of the various steps is not fixed and may be adjusted according to requirements. The division of various modules is merely function division adopted for ease of description. In an exemplary embodiment, one module may be implemented by a plurality of modules, respectively, and functions of a plurality of modules may also be implemented by the same module. These modules may be located in the same device, or may be located in different devices.

It can be understood that hardware modules in one or more embodiments described herein may be implemented mechanically or electrically. For example, one hardware module may include a specifically designed permanent circuit or logic device (for example, a dedicated processor such as an FPGA or an ASIC, or other processing circuitry) configured to perform specific operations. The hardware module may also include a programmable logic device or circuit (for example, including a general-purpose processor or other programmable processors), which is configured temporarily by software, to perform specific operations. Whether the hardware module is implemented in a mechanical manner, by using a dedicated permanent circuit, or by using a temporarily configured circuit (for example, configured by software) may be decided according to costs and time.

In addition, an embodiment of the present application further provides a computer-readable storage medium having a computer program stored thereon, where the computer program can be executed by a processor, to implement the motion correction method in MR imaging according to one or more of the embodiments of the present disclosure. Specifically, a system or an apparatus with a storage medium may be provided, where software program codes for implementing the functions of any one of the implementations in the above embodiments are stored on the storage medium, and a computer (or a CPU or an MPU) of the system or apparatus is caused to read out and execute the program codes stored in the storage medium. Moreover, an operating system operating on a computer may be caused to accomplish some or all of the actual operations based on an instruction of the program codes. The program codes read out from the storage medium may be further written into a memory provided in an expansion board inserted into the computer or written into a memory provided in an expansion unit connected to the computer, and then a CPU, etc. installed on the expansion board or the expansion unit is caused to execute some or all of the actual operations based on the instruction of the program codes, thereby implementing the functions of any one of the above implementations. The implementations of the storage medium for providing the program codes include a floppy disk, a hard disk, a magnetic optical disc, an optical disc (e.g., CD-ROM, CD-R, CD-RW, DVD-ROM, DVD-RAM, DVD-RW and DVD+RW), a magnetic tape, a non-volatile memory card and an ROM. Optionally, the program code may be downloaded from a server computer via a communication network.

It can be seen from the above solutions that, in the embodiments of the present disclosure, the pilot tone signal may be used to perform motion detection, the MR data collected when the motion occurs is marked as the motion damage data, the reference navigation image is obtained before the MR data collection, the post-motion navigation image is obtained when it is detected that the motion stops, the motion correction parameter corresponding to the motion is obtained by performing registration on the post-motion navigation image and the reference navigation image, then a gradient magnetic field is adjusted by utilizing the motion correction parameter to complete prospective motion correction, and then the MR data collection is restarted from the position where the MR data is marked as the motion damage data; or, the MR data collection is restarted directly from the position where the MR data is marked as the motion damage data, and finally the motion correction parameter is further utilized to perform retrospective motion correction on re-collected data. After that, a current MR image is obtained based on the MR signal data after the motion correction and MR signal data before the motion damage data, so that the collected image can be accurately corrected, thereby improving the MR imaging quality.

The above description is merely illustrative of the preferred embodiments of the present disclosure and is not intended to limit the present disclosure. Any modifications, equivalent substitutions, improvements, etc. made within the spirit and principles of the present disclosure shall fall within the scope of protection of the present disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST

S11-S15 Steps
21 Reference navigation image
22 First post-motion navigation image
23 Second post-motion navigation image
M1, M2 Motions
S1, S2 Triangular marks
31 Local coil
311 Transmit antenna
32 A/D conversion
33 Pre-processing
410 Motion detector
420 Control processor
421 Controller
422 Processor
430 First prompt module
440 Second prompt module
450 Configuration module
51 Memory
52 Processor
53 Bus

The invention claimed is:

1. A motion correction method in magnetic resonance (MR) imaging, comprising:
  obtaining, by a MR data collection apparatus, a reference navigation image before MR data collection is performed on a target region of interest;
  in performing the MR data collection on the target region of interest using the MR data collection apparatus, performing motion detection, by a motion detector and using a pilot tone signal received by a plurality of coils, and, in response to motion being detected, identifying, by a control processor, MR data collected when the motion occurs as motion damage data;
  obtaining, by the MR data collection apparatus, a post-motion navigation image in response to an end of the motion being detected using the pilot tone signal;
  performing, by the control processor, registration on the post-motion navigation image and the reference navigation image to obtain a motion correction parameter corresponding to the motion;

performing, by the control processor, motion correction on the MR data collection based on the motion correction parameter to determine corrected MR data corresponding to one or more corrected MR images; and providing the corrected MR data as an output of the control processor in electronic form as a data file.

2. A motion correction apparatus in magnetic resonance (MR) imaging, comprising:

a motion detector configured to: in a process of MR data collection, perform motion detection using a pilot tone signal received by a plurality of coils, output a first signal in response to motion being detected, and output a second signal in response to an end of the motion being detected; and a control processor configured to:

control an MR data collection apparatus to collect a reference navigation image to obtain the reference navigation image;

control the MR data collection apparatus to perform MR data collection on a target region of interest;

obtain MR data collected by the MR data collection apparatus;

mark MR data collected when the motion occurs as motion damage data when the first signal is received;

in response to the second signal being received, control the MR data collection apparatus to collect a post-motion navigation image, obtain the post-motion navigation image, and perform registration on the post-motion navigation image and the reference navigation image to obtain a motion correction parameter corresponding to the motion;

perform motion correction on the MR data collection based on the motion correction parameter to determine corrected MR data corresponding to one or more corrected MR images; and provide the corrected MR data as an output of the control processor in electronic form as a data file.

3. A motion correction apparatus in MR imaging, comprising:

at least one memory configured to store a computer program; and at least one processor configured to execute the computer program stored in the at least one memory to cause the at least one processor to:

obtain a reference navigation image before MR data collection is performed on a target region of interest;

in performing the MR data collection on the target region of interest, perform motion detection using a pilot tone signal received by a plurality of coils, and, in response to motion is detected, identifying MR data collected when the motion occurs as motion damage data;

obtain a post-motion navigation image in response to an end of the motion being detected using the pilot tone signal;

perform registration on the post-motion navigation image and the reference navigation image to obtain a motion correction parameter corresponding to the motion;

perform motion correction on the MR data collection based on the motion correction parameter to determine corrected MR data corresponding to one or more corrected MR images; and provide the corrected MR data as an output of the at least one processor in electronic form as a data file.

4. The motion correction method in MR imaging as claimed in claim 1, wherein the performing motion correction on the MR data collection based on the motion correction parameter comprises:

adjusting a currently applied gradient magnetic field, based on the motion correction parameter, to keep the target region of interest static relative to a scanning field of view; and restarting the MR data collection from a position where the MR data is identified as the motion damage data until the MR data collection ends, or when a next motion is detected using the pilot tone signal, returning to perform the operation of marking MR data collected when the motion occurs as motion damage data.

5. The motion correction method in MR imaging as claimed in claim 1, wherein the performing motion correction on the MR data collection using the motion correction parameter comprises:

restarting the MR data collection from a position where the MR data is identified as the motion damage data until the MR data collection ends, or when a next motion is detected by utilizing the pilot tone signal, returning to perform the operation of marking MR data collected when the motion occurs as motion damage data; and in response to the MR data collection ending, performing motion correction on MR data re-collected after each motion occurs based on the motion correction parameter corresponding to the motion.

6. The motion correction method in MR imaging as claimed in claim 1, further comprising: in response to the motion being detected using the pilot tone signal, triggering an automatic voice command to prompt a patient to keep static.

7. The motion correction method in MR imaging as claimed in claim 1, further comprising:

counting a number of detected motions, generating a dialog box, an operation box, or a voice instruction in response to a count value reaching a set threshold, wherein the dialog box, operation box, or the voice instruction is configured to ask a user whether the user wants to stop scanning due to frequent motions, and stopping current MR data collection in response to an affirmative reply from the user being received, and continuing with the current MR data collection in response to a negative reply from the user.

8. The motion correction method in MR imaging as claimed in claim 1, further comprising: providing predefined magnitude options for a user, and determining, based on a received user selection, a motion magnitude triggering to perform the operation of obtaining a post-motion navigation image.

9. A non-transitory computer-readable storage medium having a computer program stored thereon, when executed by a processor, controls the processor to perform the motion correction method in MR imaging as claimed in claim 1.

10. The motion correction apparatus in MR imaging as claimed in claim 2, wherein the control processor comprises:

a controller configured to:

control the MR data collection apparatus to perform MR data collection on the target region of interest;

before the MR data collection, control the MR data collection apparatus to collect the reference navigation image;

in response to the second signal being received, control the MR data collection apparatus to collect a post-motion navigation image; and in response to a motion correction parameter being obtained, control, based on the motion correction parameter, a gradient magnetic field applied for current MR imaging for adjustment, to keep the target region of interest static relative to a scanning field of view, and control the MR data collection apparatus to restart the MR data collection from a position where MR data is identified as motion damage data; and a processor configured to:
  receive the reference navigation image and the MR data that are collected by the MR data collection apparatus, mark the MR data collected in response to the motion occurring as the motion damage data when the first signal is received; and
  perform registration on the post-motion navigation image and the reference navigation image, in response to the post-motion navigation image collected by the MR data collection apparatus being obtained, to obtain the motion correction parameter corresponding to the motion, and provide the motion correction parameter for the controller.

11. The motion correction apparatus in MR imaging as claimed in claim 2, wherein the control processor comprises:

a controller configured to:
  control an MR data collection apparatus to perform MR data collection on a target region of interest, and before the MR data collection, control the MR data collection apparatus to collect a reference navigation image; and
  in response to the second signal being received, control the MR data collection apparatus to collect a post-motion navigation image, and then control the MR data collection apparatus to restart the MR data collection from a position where MR data is identified as motion damage data; and a processor configured to:
  receive the reference navigation image and the MR data that are collected by the MR data collection apparatus, and mark the MR data collected when the motion occurs as the motion damage data when the first signal is received;
  perform registration on the post-motion navigation image and the reference navigation image, in response to the post-motion navigation image collected by the MR data collection apparatus being obtained, to obtain the motion correction parameter corresponding to the motion; and
  in response to the MR data collection apparatus ending the MR data collection, perform motion correction on MR data re-collected after each motion occurs using the motion correction parameter corresponding to the motion.

12. The motion correction apparatus in MR imaging as claimed in claim 2, further comprising: a first prompt module configured to: in response to the first signal being received, trigger an automatic voice command used to prompt a patient to keep static.

13. The motion correction apparatus in MR imaging as claimed in claim 2, further comprising: a second prompt module configured to:
  count the number of detected motions based on the received first signal,
  in response to a count value reaching a set threshold, generate a request for a user requesting a response from the user as to whether to stop scanning, and
  provide a third signal to the control processor in response to the response from the user indicating the scanning is to be stopped,
  wherein the control processor is configured to control, based on the third signal, the MR data collection apparatus to stop the MR data collection.

14. The motion correction apparatus in MR imaging as claimed in claim 2, further comprising:
  a configuration module configured to: provide predefined level options representing different magnitudes of motion for a user, and configure, based on a received user option, the motion detector with a motion magnitude triggering to perform the operation of sending a first signal.

15. The motion correction method in MR imaging as claimed in claim 8, wherein the predefined magnitude options comprise high-, moderate- and low-motion magnitude options.

16. The motion correction apparatus in MR imaging as claimed in claim 12, further comprising: a second prompt module configured to:
  count the number of detected motions based on the received first signal,
  in response to a count value reaching a set threshold, generate a request for a user requesting a response from the user as to whether to stop scanning, and
  provide a third signal to the control processor in response to the response from the user indicating the scanning is to be stopped,
  wherein the control processor is configured to control, based on the third signal, the MR data collection apparatus to stop the MR data collection.

* * * * *